United States Patent [19]

Fulton

[11] 4,400,631

[45] Aug. 23, 1983

[54] HIGH CURRENT GAIN JOSEPHSON JUNCTION CIRCUIT

[75] Inventor: Theodore A. Fulton, Warren Township, Somerset County, N.J.

[73] Assignee: Bell Telephone Laboratories, Incorporated, Murray Hill, N.J.

[21] Appl. No.: 233,949

[22] Filed: Feb. 12, 1981

[51] Int. Cl.³ .................. H03K 17/92; H03K 19/195; H03K 3/38
[52] U.S. Cl. .................................... 307/245; 307/306; 307/476
[58] Field of Search ............... 307/242, 245, 306, 462, 307/476; 357/5; 365/162

[56] References Cited

U.S. PATENT DOCUMENTS

| 3,281,609 | 10/1966 | Rowell | 307/306 |
| 3,978,351 | 8/1976 | Zappe | 307/306 |
| 4,012,642 | 3/1977 | Guéret | 307/306 |
| 4,051,393 | 9/1977 | Fulton | 307/306 |
| 4,274,015 | 6/1981 | Faris | 307/306 |

Primary Examiner—John Zazworsky
Attorney, Agent, or Firm—Michael J. Urbano

[57] ABSTRACT

A superconductive circuit is described for diverting bias current to an output line in response to magnetic field control means. A first plurality of branches containing magnetically switchable Josephson junction gates are connected in parallel, and a second plurality of the same gates, less than or equal in number to the first plurality, are actuated essentially simultaneously by the control means. As a consequence, high-gain, high-speed operation is made possible.

4 Claims, 1 Drawing Figure

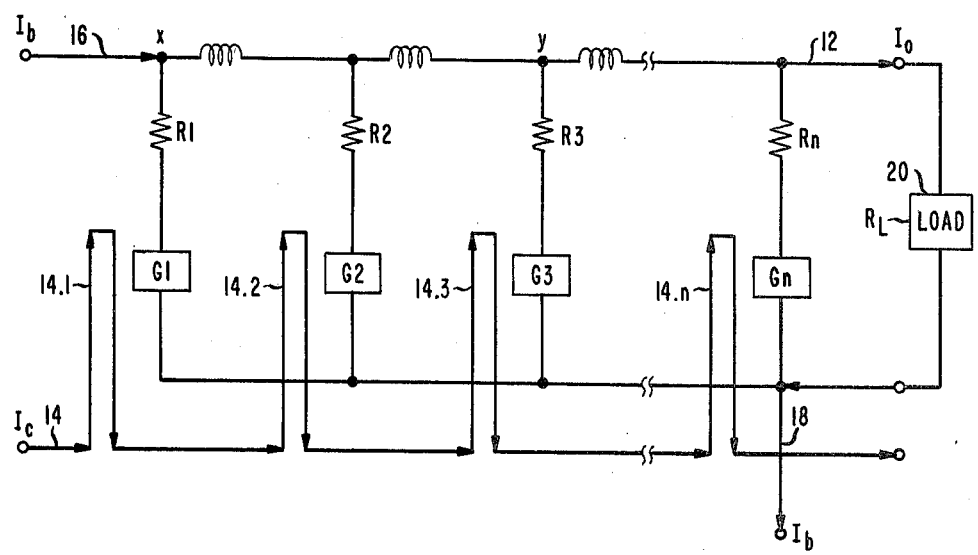

HIGH CURRENT GAIN JOSEPHSON JUNCTION CIRCUIT

BACKGROUND OF THE INVENTION

This invention relates to Josephson junction circuits and, in particular, to such circuits having enhanced current gain.

According to the original scheme of J. M. Rowell (U.S. Pat. No. 3,281,609), Josephson tunnel junctions having hysteretic I-V characteristics are used to perform logic functions with a fixed bias current $I_b$ by employing a magnetic field to reduce the critical current $I_J$ below $I_b$. The resulting voltage can be used to generate current through a load, and the magnetic field generated by this load current can then be used to control Josephson junctions in subsequent logic stages.

Analysis of this technique for controlling Josephson junctions indicates that the magnetic field B required to reduce $I_J$ significantly must be large enough that the flux $\phi$ linking the junction is $\phi = k\phi_o$, where $\phi_o$ is the flux quantum and k is of the order of unity. Thus, a junction of length l and magnetic thickness $(2\lambda + d)$ requires $$B = k\phi_o / [l(2\lambda + d)] \tag{1}$$

where $\lambda$ is the London penetration depth and d is the thickness of the barrier layer. In addition, the magnetic field underneath a control line of width w carrying a current $I_c$ is $$B = \mu_o I_c / W \tag{2}$$

where $\mu_o$ is the magnetic permeability. Combining equations (1) and (2), we see that for a current in a control line to have an appreciable effect on $I_J$ it must be of order $$I_c = \frac{w}{l} \frac{k\phi_o}{\mu_o(2\lambda + d)} \tag{3}$$

For a typical value of $2\lambda + d$, say 1600 Angstroms, $\phi_o = 2.07 \times 10^{-15}$ Webers and $\mu_o = 4\pi \times 10^{-7}$ henry/meter, equation (3) gives $$I_c = \frac{w}{l} k10.3 \text{ mA}.$$

So, for a square junction with a control line of the same width, a typical configuration, one must deal with critical currents of several mA. Note also that the junction bias currents themselves will create magnetic fields of the same order, leading to the conclusion that this logic design requires junctions with considerable self-field effects. For junctions which are not square, the current levels are proportionately smaller; but the same problem holds in that appreciable self-field effects are encountered. Self-field effects tend to cause undesirable resonance features at lower voltages and smaller ratios of the maximum-to-minimum $I_J$ in the presence of magnetic fields.

Much the same problem occurs with interferometers. In order to get enough gain, the critical currents and bias currents must be large enough to cause appreciable self-magnetic fields. In the case of interferometers, this requirement implies that the loop inductances L and critical currents $I_J$ must be such that $LI_J \gtrsim k\phi_o$, where K is of the order of unity.

One approach to solving this problem is described in a modified goalpost (GP) circuit shown in FIG. 3 of my U.S. Pat. No. 4,051,393. There, a plurality 18 of branches containing junction-resistor combinations are connected in parallel with a GP in order to increase the fan-out current (col. 8, lines 29-45). However, this circuit operates in an avalanche mode with the parallel branch nearest GP 12 being first to switch to a high impedance state, and, conversely, with the farthest branch being last to switch. As a result, relatively long times are required to complete switching, thereby limiting the speed of the logic circuits.

SUMMARY OF THE INVENTION

In accordance with the present invention, magnetic field switching of Josephson junction gates is achieved notwithstanding that the individual gates have relatively low gain; for example, gain inadequate to allow a single gate to be used alone. The essence of my invention is to provide gain by stacking a plurality n of magnetically switchable gates in parallel and to apply bias current so that each gate is initially in its low impedance $V = 0$ state. Control means applies a magnetic field to all of the gates essentially simultaneously, causing them to switch essentially simultaneously to their high impedance $V \neq 0$ states. The total bias current is thereby rapidly diverted to the output line. Because the gates switch essentially simultaneously, speed of operation is considerably faster than that of the avalanche mode.

In applications which require somewhat less speed, the control means may be adapted to apply magnetic fields to fewer than all of the parallel gates. This circuit configuration may be useful in facilitating fabrication by simplifying the conductor topology.

BRIEF DESCRIPTION OF THE DRAWING

My invention, together with its various features and advantages, can be readily understood from the following more detailed description taken in conjunction with the accompanying drawing in which the sole FIGURE shows a Josephson junction circuit schematic in accordance with an illustrative embodiment of my invention.

DETAILED DESCRIPTION

General Considerations

Before discussing my invention in detail, several matters should be understood. First of all, each of the circuits to be described is in practice maintained within a cryogenically cooled environment well known in the art in order to reduce the temperature below the superconducting transition temperature of the superconductors used to form the circuits. Secondly, each of the circuits is in practice typically fabricated on, but insulated from, a superconducting ground plane. The thickness of the insulator between the ground plane and the circuit elements can be used, in conjunction with the thickness and length of the elements, to control the inductances of the circuit branches. Alternatively, the ground plane may be patterned with apertures to control the inductances. Third, in the drawing discrete inductors are depicted for the purpose of explanation only. These inductors actually represent the distributed self-inductance or mutual inductance of the superconductive conductors or strip lines. All such conductors have some inductance, but inductors are shown only where helpful to the discussion. No lumped-circuit inductors are actually utilized. The conductors, of course, also possess distributed capacitance and hence may be viewed as transmission lines. In cases where the transmission line characteristic impedance is large compared to circuit resistance, only the inductances of the conductors need be considered in describing circuit operation. Fourth, the drawing also depicts discrete resistors which are formed by inserting segments of normal metals or nonsuperconductors in the otherwise superconducting circuit paths.

High-Gain Embodiment

With reference now to the FIGURE, there is shown a superconductive circuit comprising a plurality n of magnetically switchable Josephson junction gates Gn (n=1,2 . . . ) for diverting bias current $I_b$ from a shunt branch 16–18 to a fanout line 12 in response to control means depicted as a control current $I_c$ flowing in conductor 14. Bias current $I_b$ is applied in such a way that initially each gate is in its low impedance V=0 state. That is, the magnitude of $I_b$, the impedance of the various circuit branches and the point at which $I_b$ is connected to the array, are mutually adapted so that the portion of $I_b$ flowing through each gate is below its critical current. For example, the bias current may enter the parallel array at node x via electrode means 16 and flows through the gates to return path electrode means 18. Alternatively, the bias current may be connected to the array at a node y which would render the circuit configuration symmetric when n=5. In addition, a resistor Rn may be connected in series with each gate Gn so that each gate carries the same amount of bias current. Then, if the gates are essentially identical, they will switch to their high impedance V≠0 state in response to essentially the same level of control signal.

As depicted, the control signal means comprises a current-carrying conductor 14 which has a segment 14.n disposed in close proximity to each gate Gn so that the magnetic field generated by the control current $I_c$ depresses essentially simultaneously the critical current $I_J$ of each gate below that portion of the bias current flowing in each gate. The actuated gates switch essentially simultaneously from a low impedance V=0 state to a high impedance V≠0 state, thereby causing essentially all of the bias current $I_b$ to be diverted to the fanout line 12 as output current $I_o$. This output current flows to utilization means 20 illustratively another Josephson junction gate or circuit.

Without this type of parallel arrangement, the amount of bias current (that is, using a single gate) which is available to be diverted to output current $I_o$ is essentially limited by the critical current of the single gate, which in turn is a function of the size of its junctions and of their constituent materials. Use of larger junctions increases $I_J$ and enables $I_b$ (and hence $I_o$) to be larger but also reduces the packing density, i.e., the number of gates or junctions per unit area. In order to increase $I_o$ and yet keep $I_J$ relatively low, the parallel array described above is utilized. Accordingly, $I_b$ can be made much larger because, when the gates are in their low impedance states, the excess bias current is split among the various parallel branches. However, when the control current $I_c$ is applied, the current in segments 14.n generates magnetic fields which are coupled to the gates. Because the propagation time of $I_c$ in conductor 14 is much less than the switching time of the gates, the magnetic fields are applied essentially simultaneously to the gates. Consequently, the gates Gn switch essentially simultaneously to their high impedance V≠0 states and divert essentially all of the increased bias current to the fanout line 12. Increased output current $I_o$ is thereby provided for essentially the same control current $I_c$—hence current gain is increased.

This increased current gain can be exploited in several ways. First, the output line 12 may be split into two output lines each carrying a current of, say, $nI_b/2$. Thus, one realizes parallel fanout which may be a faster way to drive downstream gates and may also occupy less wafer area. Second, the gates themselves may have inadequate current gain to be used alone, but when combined in the parallel configuration they provide adequate gain to control other circuits. This type of low-gain gate includes, for example, a single junction with low self-field effects or an interferometer with low $LI_J/\phi_o$ ratio. These latter two gates have other desirable characteristics (e.g., higher voltage resonance features and larger ratios of $I_J(max)/I_J(min)$ in response to a magnetic control field) which might not be exploitable in some systems but for their application in the present invention.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. Although the FIGURE depicts an embodiment in which all of the gates Gn are coupled to control line 14, it may be desirable (e.g., for topological reasons affecting the ability to fabricate control conductor segments 14.n adjacent every gate Gn) to have the control line segments coupled to fewer than all of the gates. Thus, whereas a first plurality n of gates may be connected in parallel, the control line may be coupled only to a second plurality k, where $2 \leq k \leq n$. For example, with k=2 the first gate G1 and the last gate Gn would probably be the easiest to couple to the control line. While this embodiment may simplify fabrication, it would tend to have slower switching times.

In addition, the gates Gn may take on a variety of configurations including, for example, a single Josephson junction, an interferometer, a goalpost circuit or a huffle circuit (the latter is described in my copending application with A. F. Hebard, Ser. No. 974,376 filed on Dec. 29, 1978, now abandoned in favor of continuation application Ser. No. 232,011 filed on Feb. 6, 1981), all of which can be switched by a magnetic-field. Alternatively, a circuit in accordance with my invention may itself be viewed as a magnetically switched gate, in which case a pair of such circuits may be employed as the two gates coupled by the passive network of a huffle circuit.

What is claimed is:

1. A high current gain superconductive circuit for diverting bias current from a shunt branch to an output branch comprising:
   a plurality n of Josephson junction gates connected in said shunt branch in parallel with each other, each of said gates capable of being switched from a low impedance state to a high impedance state by the application thereto of a magnetic field which depresses the critical current of said gates below the bias current flowing therethrough, each of said gates also being individually capable of diverting said bias current to said output branch when switched to said high impedance state, electrode means for causing bias current to flow through said gates at a level below said critical currents, and control means comprising a single control signal source coupled to a single control line for applying said magnetic field essentially simultaneously and directly to a second plurality k of said gates, where $2 \leq k \leq n$, thereby diverting said bias current to said output branch.

2. The circuit of claim 1 wherein said control means applies said magnetic field essentially simultaneously to all of said gates (k=n).

3. The circuit of claim 1 for controlling a second circuit by means of the current flowing in said output branch wherein each of said gates itself has insufficient current gain to control said second circuit.

4. A high current gain superconductive circuit for diverting bias current from a shunt branch to an output branch comprising:

a plurality n of Josephson junction gates connected in said shunt branch in parallel with each other, each of said gates capable of being switched from a low impedance state to a high impedance state by the application thereto of a magnetic field which depresses the critical current of said gates below the bias current flowing therethrough, each of said gates also being individually capable of diverting said bias current to said output branch when switched to said high impedance state, electrode means for causing bias current to flow through said gates at a level below said critical currents, each of said gates being essentially identical to one another and further including a resistor connected in series with each of said gates so that each of said gates carries essentially the same amount of bias current, and control means comprising a single control signal source coupled to a single control line for applying said magnetic field essentially simultaneously and directly to a second plurality k of said gates, where $2 \leq k \leq n$, thereby diverting said bias current to said output branch.

* * * * *